(12) United States Patent
Wetjens et al.

(10) Patent No.: US 9,051,487 B2
(45) Date of Patent: Jun. 9, 2015

(54) HOT MELT INK COMPOSITION, METHOD FOR PREPARING A HOT MELT INK COMPOSITION AND USE THEREOF

(71) Applicant: OCE-TECHNOLOGIES B.V., Venlo (NL)

(72) Inventors: Peter M. A. Wetjens, Sevenum (NL); Frederik L. E. M. Suilen, Swalmen (NL); Patrick J. W. Deckers, Sevenum (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 14/309,396

(22) Filed: Jun. 19, 2014

(65) Prior Publication Data
US 2014/0299366 A1 Oct. 9, 2014

Related U.S. Application Data

(63) Continuation of application No. PCT/EP2012/077015, filed on Dec. 28, 2012.

(30) Foreign Application Priority Data

Jan. 6, 2012 (EP) .................................. 12150370

(51) Int. Cl.
| | |
|---|---|
| *C09D 11/02* | (2014.01) |
| *C09D 11/34* | (2014.01) |
| *C09D 11/08* | (2006.01) |
| *C09D 11/10* | (2014.01) |
| *H05K 3/06* | (2006.01) |
| *H05K 1/09* | (2006.01) |

(52) U.S. Cl.
CPC ............... *C09D 11/34* (2013.01); *C09D 11/08* (2013.01); *C09D 11/10* (2013.01); *H05K 3/061* (2013.01); *H05K 2203/013* (2013.01); *H05K 1/092* (2013.01); *H05K 3/06* (2013.01)

(58) Field of Classification Search
CPC ....................................................... C09D 11/34
See application file for complete search history.

(56) References Cited

U.S. PATENT DOCUMENTS

| | | | |
|---|---|---|---|
| 6,471,758 B1 * | 10/2002 | Kelderman et al. ........ | 106/31.29 |
| 2005/0245640 A1 | 11/2005 | Kuiper et al. | |
| 2007/0120919 A1 * | 5/2007 | Goredema et al. ............. | 347/99 |
| 2009/0082489 A1 * | 3/2009 | Breton et al. ................. | 523/200 |

FOREIGN PATENT DOCUMENTS

| | | |
|---|---|---|
| EP | 1 033 222 A1 | 9/2000 |
| EP | 1 067 157 A1 | 1/2001 |
| WO | WO 2008/021780 A1 | 2/2008 |

OTHER PUBLICATIONS

International Search Report issued in PCT/EP2012/077015, dated Sep. 20, 2013.
Written Opinion of the International Searching Authority issued in PCT/EP2012/077015, dated Sep. 20, 2013.

* cited by examiner

*Primary Examiner* — Veronica F Faison
(74) *Attorney, Agent, or Firm* — Birch, Stewart, Kolasch & Birch, LLP (57) ABSTRACT

The invention relates to a hot melt inkjet ink composition, the hot melt inkjet ink composition being solid at room temperature and liquid at an elevated temperature, the hot melt inkjet ink composition comprising an acidic resin and a crystalline material. The invention relates further to the use of the hot melt inkjet ink composition as an etch resist and to a process for preparing an electrically conductive circuit on a support layer using the hot melt inkjet ink composition.

12 Claims, 4 Drawing Sheets

HOT MELT INK COMPOSITION, METHOD FOR PREPARING A HOT MELT INK COMPOSITION AND USE THEREOF

CROSS REFERENCE TO RELATED APPLICATIONS

This application is a Continuation of PCT International Application No. PCT/EP2012/077015 filed on Dec. 28, 2012, which claims priority under 35 U.S.C. §119(a) to patent application Ser. No. 12/150,370.0 filed in the European Patent Office on Jan. 6, 2012, all of which are hereby expressly incorporated by reference into the present application.

The present invention relates to a hot melt ink composition. The present invention further relates to a method for preparing a hot melt ink composition and use of a hot melt ink composition

BACKGROUND OF THE INVENTION

The use of an etch resist ink in the production of printed circuit boards (PCB's) is known in the art. For example, a process of making PCB's by printing an image of an etch resist ink onto a substrate comprising a top layer of an electrically conductive material, is known. In a subsequent step of the process, the part of the top layer not covered by the etch resist ink is removed, by treating the substrate with an etching solution. In a later step, the image of etch resist ink is removed, yielding a PCB. The removal of the part of the top layer not covered by the etch resist is generally performed by treating the substrate with an acidic etching solution. Therefore, the etch resist ink has to be resistant to the acidic etching solution.

When preparing a PCB, it is important that the image of etch resist ink, provided on the substrate, is robust, such that the substrate may be moved between the different baths used in the etching process, without damaging the image of etch resist ink. Moving the substrate may be done using conventional transport systems, e.g. transport systems comprising a belt. The belt may damage the printed image, when contacting the substrate provided with the image of etch resist ink. Damaging of the print may result in unwanted areas of the substrate being etched, leading to disruptions in the electronic circuitry, as a result of which the PCB may not function due to an interruption in the electronic connections.

It is therefore an object of the invention to provide a hot melt inkjet ink composition that is suitable to be used as an etch resist and shows improved print robustness.

SUMMARY OF THE INVENTION

The object is achieved in a hot melt inkjet ink composition, the hot melt inkjet ink composition being solid at room temperature and liquid at an elevated temperature, the hot melt inkjet ink composition comprising an acidic resin and a crystalline material. In the context of the present invention, a hot melt inkjet ink composition is a composition that is solid at room temperature and liquid at an elevated temperature.

Acidic Resin

The hot melt inkjet ink composition may comprise an acidic resin. The acidic resin may be in a molten state at elevated jet temperatures. The acidic resin may solidify when cooling down.

An advantage of the use of resins in hot melt inkjet ink compositions is that dyes can be dissolved relatively well therein and pigments can be dispersed relatively easily therein. The acidic resin may provide the hot melt inkjet ink composition with resistance against an acidic etching solution. In addition, the acidic resin may dissolve in a basic solution. The acidic resin may have a viscosity less than 1000 mPa·s at 140° C., preferably less than 500 mPa·s at 140° C., more preferably less than 250 mPa·s at 140° C. The acid resin may have an acid number in the range of 30 g KOH/mol-300 g KOH/mol, preferably in the range of 60 g KOH/mol-250 g KOH/mol, more preferably in the range of 100 g KOH/mol-200 g KOH/mol.

The acidic resin may be selected from, but not limited to, acidic wood-rosin-based resins, acidic gum-rosin-based resins and acidic tall-oil-based resins.

Non-limiting examples of the acidic resins are shown in table 1.

TABLE 1

Examples of acidic resins

| No. | Name (manufacturer) | chemical description | acid nummer (g KOH/mol) |
|---|---|---|---|
| 1 | Poly Pale ™ (Eastman) | partially dimerized gum rosin | 155 |
| 2 | Dymerex ™ (Eastman) | dimerized gum rosin | 145 |
| 3 | Staybelite ™ Resin E (Eastman) | partially hydrogenated gum rosin | 162 |
| 4 | Foral ™ AX-E (Eastman) | hydrogenated gum rosin | 165 |
| 5 | HYPALE CH (Arakawa Chemical Inc.) | hydrogenated rosin | ≥157 |
| 6 | FORAL ® AX (Pinova) | hydrogenated rosin | ≥158 |
| 7 | FORAL ® DX (Pinova) | hydrogenated rosin | ≥158 |
| 8 | FORAL ® NC (Pinova) | hydrogenated wood rosin | 120-138 |
| 9 | Abieta DR 385 A (Arizona Chemical) | dehydrogenated/ partially hydrogenated Rosin | 150-163 |

In an embodiment, the acidic resin is an acidic rosin-based resin. The acidic rosin based resin may be a non-hydrogenated rosin based resin, a partially hydrogenated rosin based resin or a fully hydrogenated rosin based resin. Acidic rosin based resins, such as, but not limited to the commercially available Foral™ AX-E and Staybelite™ Resin E, are well suited to be used in an etch resist hot melt ink. The presence of a carboxylic acid functional group provides them with resistance to an acidic etching solution and solubility in a basic environment. Moreover, these resins may have a low viscosity, such as a viscosity in the range of 25 mPa s-180 mPa s at a temperature of 140° C. Because of this low viscosity, they are suitable to be jetted by an inkjet apparatus.

Crystalline Material

The hot melt inkjet ink composition may comprise a crystalline material. The crystalline material may be in a molten state at normal jet temperatures. The crystalline material may crystallize when cooling down. After a droplet of the hot melt ink composition has been jetted onto a receiving medium, the droplet may cool down. Upon cooling down, the hot melt inkjet ink composition may solidify and the crystalline material may crystallize. The melt viscosity of the crystalline material may be sufficiently low, typically lower than 20 cP, at the regular jet temperatures. Depending e.g. on the type of crystalline material used and the overall composition of the hot melt inkjet ink composition, the speed of crystallization after printing may vary. Also other parameters may play a role in the crystallization process, such as the temperature of the ink in the print head, the temperature of the receiving medium and the presence of contaminants. Preferably, the speed of crystallization should not be too high. If the crystalline material crystallizes very fast, a droplet may have become (partially) crystalline, before a droplet, applied onto an adjacent position, is applied to the receiving medium. In that case, the freshly jetted droplets is still fluid, but the adjacent droplet applied earlier, is already (partially) crystalline. This results in a weak interaction between the fluid droplet and the (partially) crystalline droplet. If the interaction between the droplets is weak, the droplets may not merge and may not or hardly contact one another. This may result in small regions in between the droplets not being covered with the hot melt inkjet ink composition. It may further result in a less robust image of the hot melt inkjet ink composition.

Thus, it is preferred that the crystalline material does not crystallize too fast. On the other hand, the speed of crystallization should not be too low. If it takes too long for the crystalline material to crystallize, the droplet may spread too much on the receiving medium. This may result e.g. in a lower resolution of the printed image, compared to an image formed by a faster crystallizing crystalline material.

By crystallization of the crystalline material after printing, crystalline regions may be formed in the printed image. These crystalline regions may provide the print with rigidity, rendering the printed image more robust. Therefore, hot melt inkjet ink compositions comprising at least one crystalline material provide more robust images, compared to similar hot melt inkjet ink compositions not comprising a crystalline material.

The crystalline material may be selected e.g. from a crystalline monoester compound, a crystalline diester compound, a crystalline diether compound, a crystalline diamide compound or a crystalline sulphonamide compound.

Non-limiting examples of the crystalline material are shown in table 2.

TABLE 2

Examples of crystalline materials

| Compound no. | Molecular structure |
|---|---|
| 10 |  n = 4, 5, 6, 7, 8 or 9 |
| 11 |  n = 6, 7, 8, 9, 10, 11, 12, 13, 14, 15 or 16 |
| 12 |  n = 2, 3 or 4 |
| 13 |  |
| 14 |  n = 1, 2, 3, 4, 5 or 6 |
| 15 |  n = 3, 4, 5 or 6 |

TABLE 2-continued

Examples of crystalline materials

Compound no. Molecular structure

16 
n = 3, 4, 5 or 6

17 
n = 4, 5, 6, 7, 8, 9 or 10

18 
n = 2, 4, 6, 8, 10

19

20

21 
$9 \leq x + y + z \leq 11$

22

23 
n = 1, 2, 3, 4, 5, 6

24

TABLE 2-continued

Examples of crystalline materials

| Compound no. | Molecular structure |
|---|---|
| 25 |  |
| 26 |   n = 0, 1, 2, 3, 4, 5, 6 |

In compound 22, $R_1$ and $R'_1$ are the same or different and are selected from a C1-8 alkyl or C1-8 alkoxy, $R_2$ is a C1-12 linear alkane diyl or a C5-12 alkane diyl which contains an alicyclic group, and n is equal to 0, 1, 2, or 3. These bis-ester compounds have melting temperatures suitable for forming a hot melt composition.

In an embodiment, the crystalline material comprises a monomeric compound.

Polymeric compounds generally do have a polydispersity exceeding 1. This means, that the polymeric material does not consist of a single component, but of a number of components, having a different molecular weight. Because of the molecular weight distribution, also other properties may be less well defined. For example, polymeric materials generally do not have a sharp melting point. Monomeric compounds instead, do not show a distribution in molecular weight. Therefore, the properties of the monomeric compound may be well defined. Moreover, since all the molecules of the monomeric compound may be identical, crystallization of the material may be more easy. When a material crystallizes, the molecules of which the material is build up, are ordered in a specific way. This is more easy when all molecules are identical.

In an embodiment, the crystalline material comprises an ester compound comprising an aromatic end group. Without wanting to be bound to any theory, the fact that the crystalline material comprises an aromatic end group and therefore comprises a rigid aromatic moiety, is believed to provide the resulting ester with rigidity. This may enhance the robustness of the hot melt inkjet ink composition. The nature of the aromatic end group, as well as the nature of other parts of the crystalline material may be used to tune the interactions between crystalline material and the other components present in the hot melt inkjet ink composition. Optionally, the aromatic end group may be provided with one or more substituent. Examples of such substituents are hydroxyl groups, alkyl group, such as alkyl groups comprising 1, 2 or 3 C-atoms, and alkoxy groups comprising 1, 2 or 3 C-atoms.

In a further embodiment, the crystalline material comprises a diester compound comprising an aromatic end group.

In an embodiment, the crystalline material may have an acid number in the range of 0 g KOH/mol-50 g KOH/mol, preferably 0.1 g KOH/mol-20 g KOH/mol, more preferably 0.2 g KOH/mol-10 g KOH/mol.

The hot melt inkjet ink composition may comprise one type of crystalline material or may comprise a plurality of types of crystalline materials.

Gelling Agent

In an embodiment, the hot melt inkjet ink composition may further comprise a gelling agent. A function of the gelling is to thicken the ink once it has been jetted onto the receiving material and to thereby control the spreading behavior of the ink onto the receiving material. The hot melt inkjet ink composition that is present in the print head may be in a fluid state. After a droplets of the hot melt inkjet ink composition has been jetted onto the receiving medium, the droplet may cool down. Upon cooling down, the hot melt composition may solidify and may (partially) crystallize. However, the hot melt inkjet ink composition may not solidify and/or crystallize instantaneously, once it has reached the receiving medium; these processes may take some time. After a droplet of hot melt inkjet ink composition has reached the receiving medium, but before it has solidified and/or crystallized, the droplet may still be in the fluid state and may spread on the surface of the receiving medium. This may result in lower resolution of the printed image. The spreading of the droplet on the surface of the receiving medium may be decreased by addition of a gelling agent, which may thicken the inkjet ink composition. By addition of a gelling agent, a more slowly crystallizing hot melt inkjet ink composition may be applied, without decreasing the resolution of the printed image. By applying a more slowly crystalline hot melt ink composition comprising a gelling agent, droplets that are jetted onto the receiving medium stay in a fluid, gelled phase for a longer time, such that droplets, that are jetted onto a adjacent position on the receiving medium at a later time, may still interact with the droplet jetted onto the receiving medium before.

Interaction between droplets is beneficial to print robustness. Thus, by applying a gelling agent, a slowly crystallizing material may be used, thereby allowing droplets of the hot melt inkjet ink composition that are jetted onto adjacent positions on the receiving substrate at different times to interact, without decreasing the resolution of the printed image.

A number of non-limiting examples of the gelling agent are: ketones such as 11-heneicosanone, laurone, 13-pentacosanone, myristone, 15-nonacosanone, palmitone, margarone, stearone, 19-nonatriacontanone, arachidone, 21-hentetracontanone, behenone, 23-pentatetracontanone, or a stearamide, or Unicid 350, Unicid 550, Unicid 700, or oligo-ester compounds, the oligo-ester compounds being the reaction product of a poly-hydroxy component, such as pentaerythritol or glycerol and an carboxylic acid comprising an alkyl chain, such as stearic acid, palmitic acid, arachidic acid, linoleic acid or myristic acid esters.

In an embodiment, the hot melt inkjet ink composition may further comprise a colorant, such as a pigment or a dye. The presence of a colorant in the hot melt inkjet ink composition enables the image printed on the receiving medium to be scanned.

The hot melt inkjet ink composition according to the present invention is suitable to be used as an etch resist ink. The hot melt inkjet ink composition according to the present invention may therefore be used, e.g. in the production of PCB's. PCB's are manufactured starting from a substrate, comprising a support layer, having provided thereon a top layer of a conductive material. The top layer may comprise cupper. These substrates are relatively expensive. In the process of manufacturing the PCB, a part of the top layer is removed by etching. Etching may permanently remove the top layer from the support layer. In case the etch resist hot melt inkjet ink composition is not applied on the desired positions of the substrate, the etching step may not result in formation of the desired conductive paths on the support layer, and may therefore result in a non-working PCB. Especially, since the substrates comprising the conductive top layer are generally expensive, it is preferred to prevent the formation of non-working PCB's. This may be achieved by scanning the image formed on the substrate before an etching step. By scanning, it can be verified that the hot melt inkjet ink composition is applied on the desired positions of the substrate and that therefore, the desired electrical circuits may be formed. However, in case the image is non-visible or hardly visible, for example because the image is colorless, it may not be possible to scan the image. However, in case a colorant is added to the hot melt inkjet ink composition, the image may be scanned.

In an aspect of the invention, a method for preparing a hot melt inkjet ink composition according to the present invention is provided, the method comprising the steps of:
  providing an acidic resin;
  providing a crystalline material;
  melt mixing the acidic resin and the crystalline material.

The acidic resin as well as the crystalline material has to be provided. They may be provided in a liquid state or in a solid state. In case all the components of the hot melt inkjet ink composition are provided in a liquid state, the hot melt cleaning composition may be prepared by mixing the liquid components.

In case at least one of the components is in a solid state, then the at least one component in a solid state has to be molten. After the at least one component in a solid state is molten, the components may be melt mixed, thereby obtaining the hot melt inkjet ink composition. After the hot melt inkjet ink composition has been obtained, it may be solidified.

In an aspect of the invention, a method for preparing an electrically conductive circuit on a support layer is provided, the method comprising:
  i. ink jet printing an image of the hot melt inkjet ink composition according to the present invention onto a receiving medium, the receiving medium comprising a top layer of conductive material on a support layer;
  ii. treating the substrate with an acidic etch solution, thereby removing parts of the top layer not covered by the hot melt ink composition;
  iii. removing the hot melt ink composition using a stripping solution.

The hot melt inkjet ink composition may be provided to an ink jet printer. A print head of the ink jet printer may be provided with a melting unit, for melting the hot melt inkjet ink composition. Alternatively, the hot melt inkjet ink composition may be provided to the print head in a molten state. When the ink is in a molten state, droplets of the ink may be jetted by the ink jet printer onto a receiving medium. This receiving medium may comprise a top layer of a conductive material on a support layer. The support layer may serve to provide the substrate with rigidity, for example during printing. In addition, the support layer may provide the electrically conductive circuit, provided on the support layer, with rigidity, after a part of the top layer has been removed. An example of an electrically conductive circuit on a support layer is a PCB. The support layer may not be removable by treating the substrate with the etching solution. Preferably, the support layer may also be resistant to the stripping solution, which may be e.g. a basic solution. The top layer comprising the conductive material may not be resistant to the etch solution and may therefore be removed upon treatment by the etch solution. During printing, the ink jet print heads and the substrate may be positioned relatively to one another in such a way, that droplets of the hot melt inkjet ink composition are jetted onto the top layer of the substrate, thereby forming an image of the top layer of the substrate. After printing, the droplets of ink may cool down, such that the ink may solidify and (partially) crystallize.

After the image of the hot melt inkjet ink composition has been applied onto the top layer of the substrate, the substrate may be provided with an acidic etch solution. Preferably, the substrate may be provided with the acidic etch solution after the hot melt inkjet ink composition has solidified. The etch solution may be an aqueous solution. The etch solution may comprise an acid, for example hydrochloric acid. The etch solution may further comprise a peroxide, such as hydrogen peroxide. The etch solution may further comprise a metal salt, such as $Fe(III)Cl_3$. The etching solution may also comprise mixtures of an acid and/or a peroxide and/or a metal salt. Upon treating the substrate with the etching solution, the parts of the top layer not covered by the hot melt inkjet ink composition may be etched and removed from the support layer. The parts of the top layer covered by the hot melt inkjet ink composition may not be etched away, because it is protected by the etch resist hot melt composition. Thus, by treating a substrate comprising a support layer and a conductive top layer that is partially covered by an etch resist hot melt inkjet composition, the part of the top layer not covered by the etch resist hot melt composition may be selectively etched away, whereas the part of the top layer covered by the etch resist hot melt composition may be selectively retained. The resulting substrate may comprise an electrically conductive path provided on the support layer. However, the conductive paths may still be covered by the etch resist hot melt composition.

After a part of the top layer has selectively been removed, the etch resist hot melt composition may be removed from the substrate. This may be done by applying a stripping solution to the substrate. The stripping solution may be an aqueous, basic solution. The stripping solution may comprise a salt, such as KOH or NaOH. The stripping solution may further comprise an alkoxyamide, such as an ethanolamide. Alternatively, the etch resist hot melt composition may be removed using a stripping composition which is in the gas phase. Alternatively; the hot melt inkjet ink composition 43 may be molten and may be removed, for example by letting the hot melt inkjet ink composition flow away from the substrate.

In an embodiment, the method further comprises the step of:

i'. scanning the image of the hot melt ink composition, wherein step i' is performed in between steps i. and ii.

Etching may permanently remove the top layer from the support layer. In case the etch resist hot melt inkjet ink composition is not applied on the desired positions of the substrate, the etching step may not result in formation of the desired conductive paths on the support layer, and may therefore result in a non-working PCB. Especially, since the substrates comprising the conductive top layer are generally expensive, it is preferred to prevent the formation of non-working PCB's. This may be achieved by scanning the image formed on the substrate before an etching step. By scanning, it can be verified that the hot melt inkjet ink composition is applied on the desired positions of the substrate and that therefore, the desired electrical circuits may be formed. In case the hot melt composition is colorless by itself, it may be hard or even impossible to scan the image provided on the substrate. In that case, a colorant is preferably added to the hot melt inkjet ink composition, such that scanning is facilitated.

In an aspect of the invention, a substrate is provided, the substrate comprising a support layer and a top layer provided on said support layer, the top layer comprising a conductive material (that is removable using an etch solution), wherein an image of the hot melt inkjet ink composition according to the present invention is provided on the side of the top layer remote from the support layer.

The substrate, wherein an image of the hot melt inkjet ink composition according to the present invention is provided on the side of the top layer remote from the support layer may be an intermediate in the method for preparing a PCB mentioned above. Generally, the entire support layer may be covered with the top layer, although this is not necessary. The substrate, wherein an image of the hot melt inkjet ink composition according to the present invention is provided on the side of the top layer remote from the support layer, may be obtained by step i. of the above mentioned method for preparing an electrically conductive circuit on a support layer. The substrate may then comprise a continuous top layer of a conductive material, provided on the support layer, wherein an image of the hot melt inkjet ink composition according to the present invention is provided on the side of the top layer remote from the support layer. The substrate may be suited to undergo an etching process, which may eventually result in the formation of an electrically conductive circuit on a support layer.

In a step of the etching process, the substrate may be treated with an acidic etch solution. Thereby, the part of the top layer not covered by the image of the hot melt inkjet ink composition may be removed, whereby the part of the top layer covered by the hot melt inkjet ink composition as well as the hot melt inkjet ink composition are not removed from the substrate. Thus, after the step of the etching process, the substrate may be converted into an intermediate for the preparation of preparing an electrically conductive circuit on a support layer, the intermediate comprising a support layer, having locally provided thereon a top layer comprising a conductive material, wherein the hot melt inkjet ink composition is provided on top of the top layer locally provided on the support layer. The locations of the substrate where the top layer is still present corresponds to the image of the hot melt inkjet ink composition that had been applied onto the top layer of the substrate.

DETAILED DESCRIPTION OF THE DRAWINGS

In the drawings, same reference numerals refer to same elements.

Figure 1A:
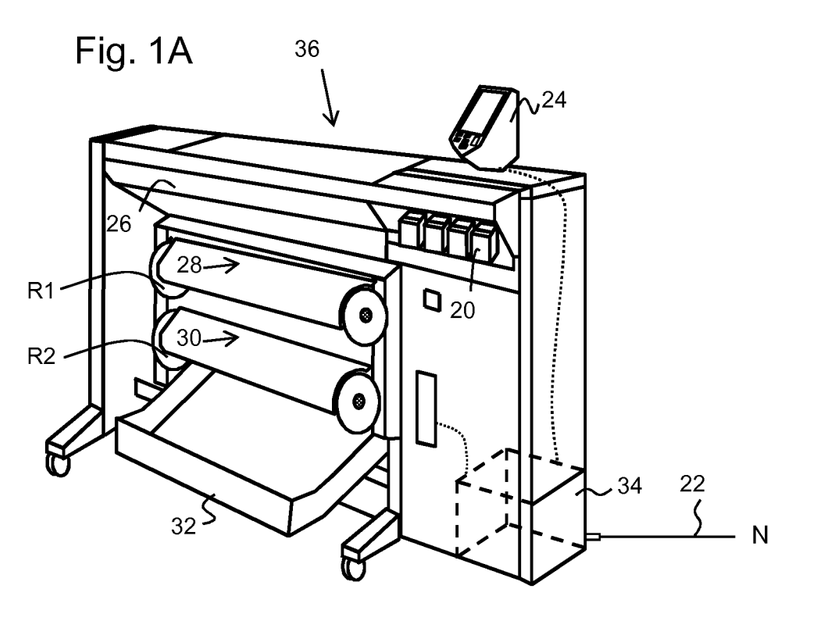
FIG. 1A shows a schematic representation of an image forming apparatus.
Figure 1B:
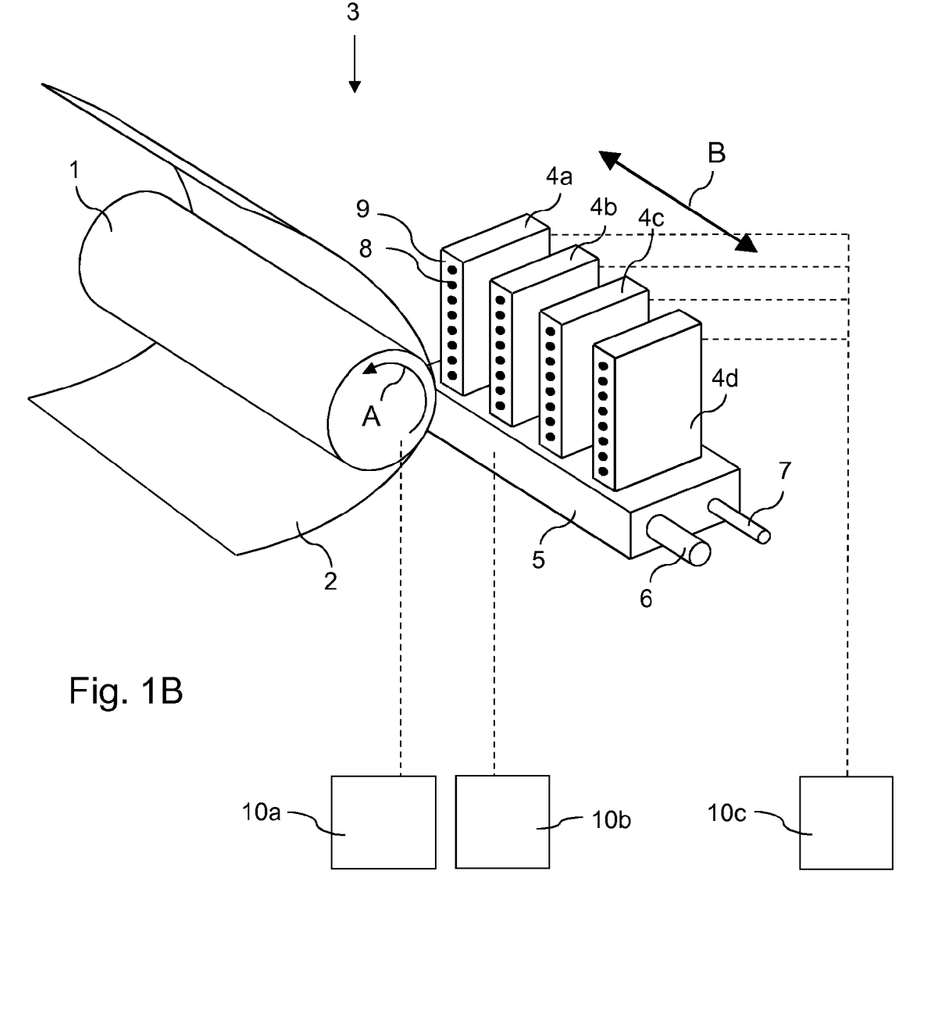
FIG. 1B shows an ink jet printing assembly

FIG. 1A shows an image forming apparatus 36, wherein printing is achieved using a wide format inkjet printer. The wide-format image forming apparatus 36 comprises a housing 26, wherein the printing assembly, for example the ink jet printing assembly shown in FIG. 1B is placed. The image forming apparatus 36 also comprises a storage means for storing image receiving member 28, 30, a delivery station to collect the image receiving member 28, 30 after printing and storage means for marking material 20. In FIG. 1A, the delivery station is embodied as a delivery tray 32. Optionally, the delivery station may comprise processing means for processing the image receiving member 28, 30 after printing, e.g. a folder or a puncher. The wide-format image forming apparatus 36 furthermore comprises means for receiving print jobs and optionally means for manipulating print jobs. These means may include a user interface unit 24 and/or a control unit 34, for example a computer.

Images are printed on a image receiving member, for example paper, supplied by a roll 28, 30. The roll 28 is supported on the roll support R1, while the roll 30 is supported on the roll support R2. Alternatively, cut sheet image receiving members may be used instead of rolls 28, 30 of image receiving member. Printed sheets of the image receiving member, cut off from the roll 28, 30, are deposited in the delivery tray 32.

Each one of the marking materials for use in the printing assembly are stored in four containers 20 arranged in fluid connection with the respective print heads for supplying marking material to said print heads.

The local user interface unit 24 is integrated to the print engine and may comprise a display unit and a control panel. Alternatively, the control panel may be integrated in the display unit, for example in the form of a touch-screen control panel. The local user interface unit 24 is connected to a control unit 34 placed inside the printing apparatus 36. The control unit 34, for example a computer, comprises a processor adapted to issue commands to the print engine, for example for controlling the print process. The image forming apparatus 36 may optionally be connected to a network N. The connection to the network N is diagrammatically shown in the form of a cable 22, but nevertheless, the connection could be wireless. The image forming apparatus 36 may receive printing jobs via the network. Further, optionally, the controller of the printer may be provided with a USB port, so printing jobs may be sent to the printer via this USB port.

FIG. 1B shows an ink jet printing assembly 3. The ink jet printing assembly 3 comprises supporting means for supporting an image receiving member 2. The supporting means are shown in FIG. 1B as a platen 1, but alternatively, the supporting means may be a flat surface. The platen 1, as depicted in FIG. 1B, is a rotatable drum, which is rotatable about its axis as indicated by arrow A. The supporting means may be optionally provided with suction holes for holding the image receiving member in a fixed position with respect to the supporting means. The ink jet printing assembly 3 comprises print heads 4a-4d, mounted on a scanning print carriage 5. The scanning print carriage 5 is guided by suitable guiding means 6, 7 to move in reciprocation in the main scanning direction B. Each print head 4a-4d comprises an orifice surface 9, which orifice surface 9 is provided with at least one orifice 8. The print heads 4a-4d are configured to eject droplets of marking material onto the image receiving member 2. The platen 1, the carriage 5 and the print heads 4a-4d are controlled by suitable controlling means 10a, 10b and 10c, respectively.

The image receiving member 2 may be a medium in web or in sheet form and may be composed of e.g. paper, cardboard, label stock, coated paper, plastic, textile, or a substrate comprising a top layer comprising a conductive material, e.g. cupper. Alternatively, the image receiving member 2 may also be an intermediate member, endless or not. Examples of endless members, which may be moved cyclically, are a belt or a drum. The image receiving member 2 is moved in the sub-scanning direction A by the platen 1 along four print heads 4a-4d provided with a fluid marking material.

A scanning print carriage 5 carries the four print heads 4a-4d and may be moved in reciprocation in the main scanning direction B parallel to the platen 1, such as to enable scanning of the image receiving member 2 in the main scanning direction B. Only four print heads 4a-4d are depicted for demonstrating the invention. In practice an arbitrary number of print heads may be employed. In any case, at least one print head 4a-4d per color of marking material is placed on the scanning print carriage 5. For example, for a black-and-white printer, at least one print head 4a-4d, usually containing black marking material is present. Alternatively, a black-and-white printer may comprise a white marking material, which is to be applied on a black image-receiving member 2. For a full-color printer, containing multiple colors, at least one print head 4a-4d for each of the colors, usually black, cyan, magenta and yellow is present. Often, in a full-color printer, black marking material is used more frequently in comparison to differently colored marking material. Therefore, more print heads 4a-4d containing black marking material may be provided on the scanning print carriage 5 compared to print heads 4a-4d containing marking material in any of the other colors. Alternatively, the print head 4a-4d containing black marking material may be larger than any of the print heads 4a-4d, containing a differently colored marking material.

The carriage 5 is guided by guiding means 6, 7. These guiding means 6, 7 may be rods as depicted in FIG. 1B. The rods may be driven by suitable driving means (not shown). Alternatively, the carriage 5 may be guided by other guiding means, such as an arm being able to move the carriage 5. Another alternative is to move the image receiving material 2 in the main scanning direction B.

Each print head 4a-4d comprises an orifice surface 9 having at least one orifice 8, in fluid communication with a pressure chamber containing fluid marking material provided in the print head 4a-4d. On the orifice surface 9, a number of orifices 8 is arranged in a single linear array parallel to the sub-scanning direction A. Eight orifices 8 per print head 4a-4d are depicted in FIG. 1B, however obviously in a practical embodiment several hundreds of orifices 8 may be provided per print head 4a-4d, optionally arranged in multiple arrays. As depicted in FIG. 1B, the respective print heads 4a-4d are placed parallel to each other such that corresponding orifices 8 of the respective print heads 4a-4d are positioned in-line in the main scanning direction B. This means that a line of image dots in the main scanning direction B may be formed by selectively activating up to four orifices 8, each of them being part of a different print head 4a-4d. This parallel positioning of the print heads 4a-4d with corresponding in-line placement of the orifices 8 is advantageous to increase productivity and/or improve print quality. Alternatively multiple print heads 4a-4d may be placed on the print carriage adjacent to each other such that the orifices 8 of the respective print heads 4a-4d are positioned in a staggered configuration instead of in-line. For instance, this may be done to increase the print resolution or to enlarge the effective print area, which may be addressed in a single scan in the main scanning direction. The image dots are formed by ejecting droplets of marking material from the orifices 8.

Upon ejection of the marking material, some marking material may be spilled and stay on the orifice surface 9 of the print head 4a-4d. The ink present on the orifice surface 9, may negatively influence the ejection of droplets and the placement of these droplets on the image receiving member 2. Therefore, it may be advantageous to remove excess of ink from the orifice surface 9. The excess of ink may be removed for example by wiping with a wiper and/or by application of a suitable anti-wetting property of the surface, e.g. provided by a coating.

Figure 2A:
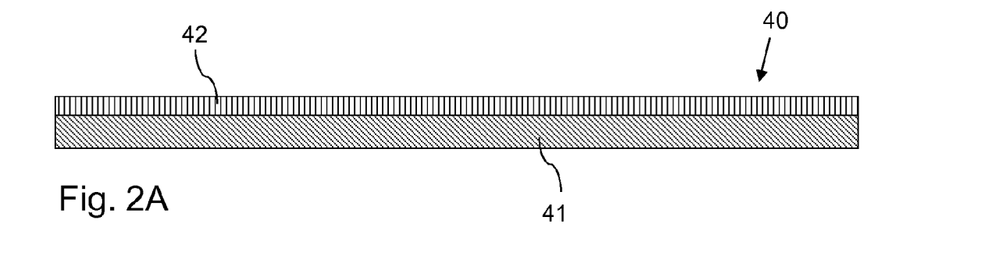
FIG. 2A-2H illustrate a method for preparing an electrically conductive circuit on a support layer

FIG. 2A shows a substrate 40, comprising a support layer 41 and a top layer 42, provided on the support layer. The top layer 42 comprises an electrically conductive material. For example, the top layer 42 may be a coating of a metal, such as cupper. The support layer 41 may be made of any suitable material. The support layer is resistant to the etching solution used in the etching process.

Figure 2B:
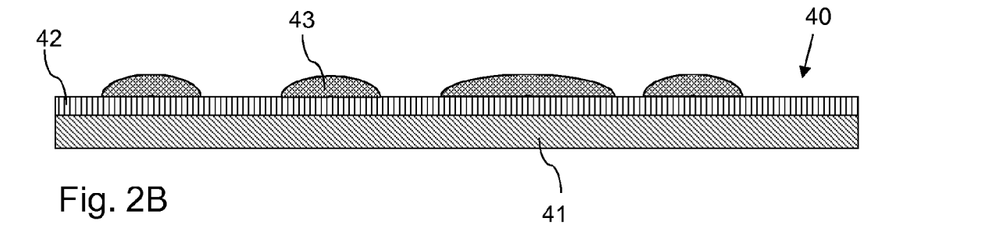
Figure 2C:
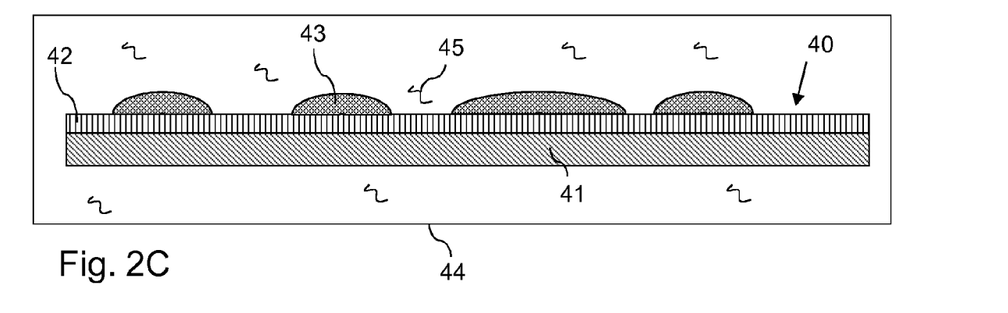

FIG. 2B, shows the substrate 40, wherein locally, droplets of a hot melt inkjet ink composition 43 have been applied onto the top layer 42 of the substrate 40. The hot melt inkjet ink composition 43 is an etch resist hot melt composition. The droplets of the hot melt inkjet ink composition 43 may be applied onto the top layer 42 of the substrate 40 by inkjet printing, for example using an inkjet printer as described with reference to FIG. 1A-1B. The droplets may be applied onto a predetermined position of the substrate 40, such that later on, predetermined parts of the top layer 42 may be removed. FIG. 2C shows the substrate 40 provided with the droplets of the hot melt inkjet ink composition 43, that is positioned in a reservoir 44. The reservoir 44 is filled with an etching solution, comprising an etchant, the etchant being schematically depicted as component 45. The reservoir may be completely filled with the solution of the etchant 45, or may be partially filled with the solution comprising the etchant 45. The substrate should be positioned such that at least the top layer 42 of the substrate, partially provided with the hot melt inkjet ink composition 43 is in contact with the etching solution. The solution comprising the etchant 45 may be a liquid. Alternatively, an etchant may be provided in the gas phase.

Figure 2D:
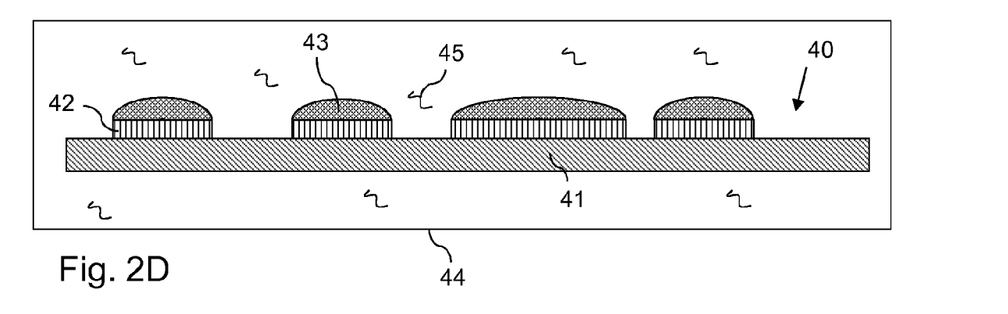

FIG. 2D, like FIG. 2C shows the substrate 40 provided with the droplets of the hot melt inkjet ink composition 43, positioned in a reservoir 44 filled with an etching solution, comprising an etchant 45. Whereas in FIG. 2C, the substrate 40 has been in contact with the etching solution for a relatively short period of time, and the top layer is still present, in FIG. 2D, the substrate 40 has been in the reservoir 44 for a longer period of time, such that the top layer 42 is removed from parts of the substrate 40 not covered by the hot melt inkjet ink composition 43. On parts of the substrate 40 covered by the hot melt inkjet ink composition 43, the top layer 42 is still present.

Figure 2E:
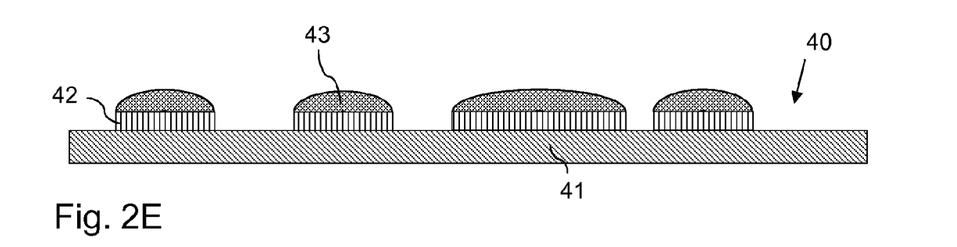

Once the top layer 42 has been removed from the substrate on the positions not covered by the hot melt inkjet ink composition 43, the substrate 40 may be removed from the reservoir 44 comprising the solution of the etchant, 45. Optionally, the substrate may be rinsed with a suitable rinsing solution, once it has been removed from the reservoir 44. FIG. 2E shows the substrate 40 after it has been removed from the reservoir 44.

Figure 2F:
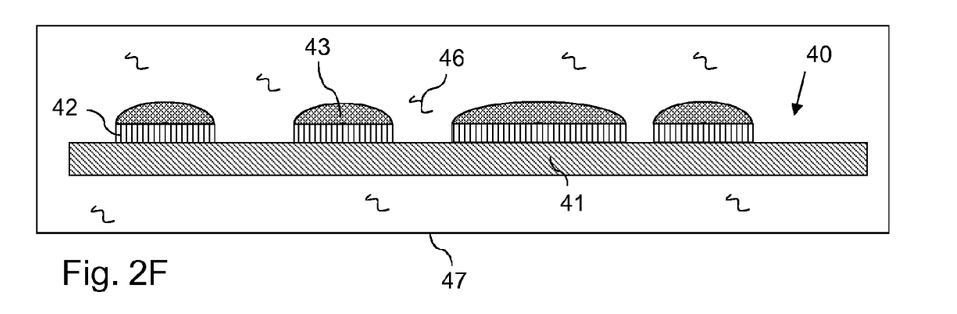

FIG. 2F shows the substrate 40, the substrate locally comprising the top layer 42, the top layer being covered with the hot melt inkjet ink composition 43. The substrate, as depicted in FIG. 2F, is positioned in a second reservoir 47, the second reservoir 47 comprising a stripping solution. As depicted in FIG. 2F, the stripping solution is a solution comprising a stripping component 46. The stripping component 46 may be an alkali salt, such as NaOH or KOH. However, the stripping solution may be any solution, suitable to remove the hot melt inkjet ink composition 43. Preferably, the stripping solution is inert towards the material of the top layer 42 and the support layer 41 of the substrate 40. The reservoir 47 may be completely filled with the solution of the stripping component 46, or may be partially filled with the solution comprising the stripping component 46. The substrate should be positioned such that at least the top layer 42 of the substrate, partially provided with the hot melt inkjet ink composition 43 is in contact with the stripping solution. The stripping solution may be a liquid. Alternatively, a stripping component 46 may be provided in the gas phase.

Figure 2G:
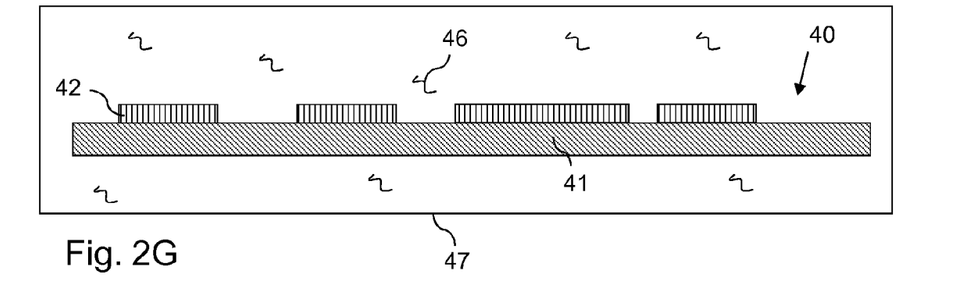

FIG. 2G, like FIG. 2F shows the substrate 40 provided with the droplets of the hot melt inkjet ink composition 43, positioned in a reservoir 47, filled with a stripping solution, comprising a stripping component 46. Whereas in FIG. 2F, the substrate 40 has been in contact with the stripping solution for a relatively short period of time, and the hot melt inkjet ink composition 43 is still present on top of the top layer 42, in FIG. 2G, the substrate 40 has been in the reservoir 47 for a longer period of time, such that the hot melt inkjet ink composition 43 is removed.

After the hot melt inkjet ink composition 43 has been removed from the substrate 40, the substrate 40 may be taken out of the reservoir 47. Optionally, the substrate may be rinsed with a suitable rinsing solution (not shown).

Figure 2H:
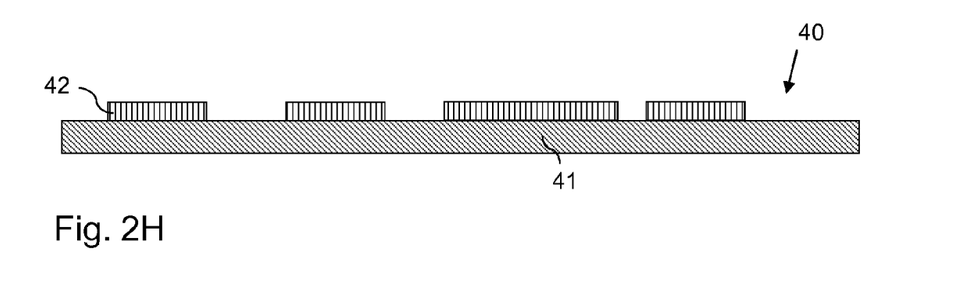

FIG. 2H shows the substrate 40 comprising the support layer 41 and locally comprising a top layer 42, the top layer comprising a conductive material. The regions of conductive material applied on the substrate 40 may form an electrically conductive circuit. The substrate, as shown in FIG. 2H may serve as a PCB.

EXPERIMENTS AND EXAMPLES

Materials

All chemicals were used as received, unless stated otherwise. Prints were made using Océ Colorwave 600 printer. As a receiving medium, substrate was used, the substrate comprising a support layer, wherein on both sides of the support layer a cupper layer having a thickness of 0.2 mm is applied.
Methods
Etching Substrate, provided with an image printed thereon, were put in a reservoir containing an etching solution. The substrates were completely submerged in the etching solution. As an etching solution, an aqueous solution of cupper chloride was used. The etching solution had a temperature of 50° C. The substrate was submerged in the etching solution for 6 minutes. After the substrate had been in the etching solution for 6 min, the substrate was taken out of the reservoir and rinsed with water. The image, as present on the substrate after the printed substrate had been rinsed with water, was compared to the print before the printed substrate was etched. In case less than 80% of the hot melt composition that had been applied onto the substrate by printing was still present on the substrate after the etching process, the etch resistance of the hot melt composition was considered poor. When 80% to 95% of the hot melt composition that had been applied onto the substrate by printing was still present on the substrate after the etching process, the etch resistance of the hot melt composition was considered moderate. In case more than 95% of the hot melt composition that had been applied onto the substrate by printing was still present on the substrate after the etching process, the etch resistance of the hot melt composition was considered good.
Stripping An image of hot melt composition was applied onto the substrate by printing using the Océ Colorwave 600 printer. The substrate, provided with the image of hot melt composition was put in a reservoir containing a stripping solution. As a stripping solution, an aqueous solution of KOH (0.5 M) was used. The stripping solution had a temperature of 52° C. The substrate was submerged in the stripping solution for 3 minutes. After the substrate had been in the stripping solution for 3 min, the substrate was taken out from the reservoir and rinsed with water. The image, as present on the substrate after the printed substrate had been rinsed with water, was compared to the printed image before the printed substrate was stripped.

In case more than 20% of the hot melt composition that had been applied onto the substrate by printing was still present on the substrate after the stripping process, the stripping ability of the hot melt composition was considered poor. When 20% to 5% of the hot melt composition that had been applied onto the substrate by printing was still present on the substrate after the stripping process, the stripping ability of the hot melt composition was considered moderate. In case less than 5% of the hot melt composition that had been applied onto the substrate by printing was still present on the substrate after the stripping process, the stripping ability of the hot melt composition was considered good.

Production Example 1

Preparation of Etch Resist Hot Melt Inkjet Ink Composition

A hot melt inkjet ink composition was prepared by combining 50 grams of compound 4 (Foral AX E, Eastman), 45 grams of compound 22, wherein $R_2$ is $(CH_2)_4$ and wherein $R_1=R_1'=OC_3H_7$, wherein the $OC_3H_7$ substituent is present on the para-position of the aromatic rings (see also EP 1221467), 1 gram of N,N'-bis(3-methoxypropyl) dodecanediamide (compound M from U.S. Pat. No. 6,685,953 B1), 3 grams of stearone (Pfaltz & Bauer) and 1 gram of Sudan Blue (SB35, Sigma Aldrich) in a vessel, heating the mixture to 150° C. and mixing. The mixture was stirring until all material was melted. The resulting fluid was filtered over a filter having pores in the range of 0.1-0.4 μm. After all ingredients were melt mixed, the resulting hot melt inkjet ink composition was formed into a cylinder having a diameter of 10 cm and the composition was allowed to cool down after which the ink composition solidified, yielding ink composition 40.

Comparative Production Examples

Comparative Production Example 1

As a comparative example, black toner pearls from Océ were used. This comparative example is referred to as CE 1.
Etching Example and Comparative Etching Example In a first comparison experiment, prints were made by providing substrates with an image using the Océ Colorwave 600. The substrates were etched. Images of the hot melt composition 40, printed on the substrate, were compared to prints made with hot melt composition CE 1 on the aspect of etch resistance. The results are shown in table 3.

TABLE 3 etch resistance.

| hot melt ink composition | etch resistance |
|---|---|
| 40 | good |
| CE 1 | moderate |

The hot melt ink composition according to the present invention (40) showed good etch resistance. The hot melt ink composition according to the comparative example (CE 1) showed moderate etch resistance. This means that the hot melt inkjet ink composition according to the present invention (40) is not or hardly removed from the substrate by the etching solution under the conditions tested. The hot melt inkjet ink composition according to the comparative example (CE 1) may protect regions of the top layer to a lesser extent than the hot melt composition 40. Thus, the hot melt inkjet ink composition according to the present invention may protect desired regions of the top layer of the substrate to be protected from the etch solution.

Stripping Example and Comparative Stripping Example

For a hot melt composition to be suitable as an etch resist in a process for preparing an electrically conductive circuit on a support layer, the hot melt composition should have both etch resistance and stripping ability. In a second comparison experiment, prints made using the Océ Colorwave 600 on the substrate were stripped. Images of the hot melt composition 40, printed on the substrate, were compared to prints made with hot melt composition CE 1 on the aspect of stripping ability. The results are shown in table 4.

TABLE 4 stripping ability.

| hot melt ink composition | stripping ability |
|---|---|
| 40 | good |
| CE 1 | poor |

The hot melt ink composition according to the present invention (40) shows good stripping ability, whereas the hot melt ink composition according to the comparative example (CE 1) shows poor stripping ability. This means that the hot melt composition according to the present invention (40) may be easily removed from the substrate in the stripping bath, whereas it is difficult to removed from the substrate in the stripping bath. After the desired portions of the conductive top layer have been removed in the etch bath, the etch resist composition should be removed from the substrate.

Thus, the hot melt composition according to the invention (40) is better suited to be used as an etch resist than the hot melt ink composition according to the comparative example (CE 1).

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any advantageous combination of such claims are herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. Hot melt inkjet ink composition, comprising:
   an acidic resin, wherein the acidic resin is an acidic rosin-based resin, the acidic rosin-based resin having an acid number in the range of 30 g KOH/mol-300 g KOH/mol; and
   a crystalline material,
   wherein the hot melt inkjet ink composition is solid at room temperature and liquid at an elevated temperature.

2. Hot melt inkjet ink composition according to claim 1, the hot melt inkjet ink composition being suitable to be jetted by an ink jet printer, wherein the hot melt inkjet ink composition is resistant to an acidic etch solution and wherein the hot melt inkjet ink composition at least partially crystallizes after being applied on a receiving medium.

3. Hot melt inkjet ink composition according to claim 1, wherein the crystalline material comprises a monomeric compound.

4. Hot melt inkjet ink composition according to claim 3, wherein the crystalline material comprises an ester compound comprising an aromatic end group.

5. Hot melt inkjet ink composition according to claim 1, wherein the hot melt inkjet ink composition further comprises a gelling agent.

6. Hot melt inkjet ink composition according to claim 1, wherein the hot melt inkjet ink composition further comprises a colorant.

7. Method for preparing a hot melt inkjet ink composition according to claim 1, the method comprising the steps of:
   providing a an acidic resin;
   providing a crystalline material;
   melt mixing the acidic resin and the crystalline material.

8. Method for preparing an electrically conductive circuit on a support layer, the method comprising:
   i. ink jet printing an image of a hot melt inkjet ink composition onto a receiving medium, the receiving medium comprising a top layer of conductive material on a support layer;
   ii. treating the substrate with an acidic etch solution, thereby removing parts of the top layer not covered by the hot melt inkjet ink composition;
   iii. removing the hot melt inkjet ink composition using a stripping solution,
   wherein the hot melt inkjet ink composition comprises an acidic resin and a crystalline material, and the hot melt inkjet ink composition is solid at room temperature and liquid at an elevated temperature.

9. Method according to claim 8, wherein the method further comprises the step of:
   i'. scanning the image of the hot melt ink composition, wherein step i' is performed in between steps i. and ii.

10. Substrate comprising a support layer and a top layer provided on said support layer, the top layer comprising a conductive material, wherein an image of a hot melt inkjet ink composition is provided on the side of the top layer remote from the support layer,
   wherein the hot melt inkjet ink composition comprises an acidic resin and a crystalline material, and the hot melt inkjet ink composition is solid at room temperature and liquid at an elevated temperature.

11. Method according to claim 8, wherein the acidic resin is an acidic rosin-based resin, the acidic rosin-based resin having an acid number in the range of 30 g KOH/mol-300 g KOH/mol.

12. Substrate of claim 10, wherein the acidic resin is an acidic rosin-based resin, wherein the acidic resin is an acidic rosin-based resin, the acidic rosin-based resin having an acid number in the range of 30 g KOH/mol-300 g KOH/mol.

\* \* \* \* \*